United States Patent [19]
Lucas

[11] Patent Number: 5,261,153
[45] Date of Patent: Nov. 16, 1993

[54] IN SITU METHOD FOR FORMING A CAPACITIVE PCB

[75] Inventor: Gregory L. Lucas, Newark, Calif.

[73] Assignee: Zycon Corporation, Santa Clara, Calif.

[21] Appl. No.: 864,440

[22] Filed: Apr. 6, 1992

[51] Int. Cl.⁵ .............................................. H05K 3/36
[52] U.S. Cl. ...................................... 29/830; 156/902; 361/761; 428/901
[58] Field of Search ................... 29/830, 840; 428/901; 361/397; 156/902

[56] References Cited

U.S. PATENT DOCUMENTS

| | | | |
|---|---|---|---|
| 3,034,930 | 5/1962 | Foudriat, Jr. | 117/212 |
| 3,142,047 | 7/1964 | Henderson | 340/174 |
| 3,348,990 | 10/1967 | Zimmerman et al. | 156/293 |
| 3,436,819 | 4/1969 | Lunine | |
| 3,469,019 | 9/1969 | Reimann | |
| 3,506,482 | 4/1970 | Hirohata et al. | 117/212 |
| 3,742,597 | 7/1973 | Davis | |
| 3,932,932 | 1/1976 | Goodman | |
| 4,187,339 | 2/1980 | Cayrol | 428/208 |
| 4,211,603 | 7/1980 | Reed | 156/659.1 |
| 4,301,192 | 11/1981 | Plichta et al. | 427/97 |
| 4,372,046 | 2/1983 | Suzuki | 29/852 |
| 4,388,136 | 6/1983 | Huie et al. | 156/252 |
| 4,389,278 | 6/1983 | Kai | 156/630 |
| 4,417,393 | 11/1983 | Becker | 29/846 |
| 4,486,738 | 12/1984 | Sadlo et al. | 338/320 |
| 4,522,888 | 6/1985 | Eichelberger et al. | 428/546 |
| 4,543,715 | 10/1985 | Iadarola et al. | 29/852 |
| 4,554,229 | 11/1985 | Small, Jr. | 430/17 |
| 4,554,732 | 11/1985 | Sadlo et al. | 29/620 |
| 4,584,627 | 4/1986 | Schilling et al. | 361/306 |
| 4,605,915 | 8/1986 | Marshall et al. | 333/238 |
| 4,616,292 | 10/1986 | Sengoku et al. | 361/414 |
| 4,633,035 | 12/1986 | McMonagle | |
| 4,635,358 | 1/1987 | Fritz | 29/853 |
| 4,636,018 | 1/1987 | Stillie | |
| 4,642,569 | 2/1987 | Hayes et al. | 324/318 |
| 4,675,717 | 6/1987 | Herrero et al. | |
| 4,739,257 | 4/1988 | Jenson et al. | 324/158 F |
| 4,775,573 | 10/1988 | Turek | 428/209 |
| 4,812,355 | 3/1989 | Yokoyama et al. | 428/901 X |
| 4,996,097 | 2/1991 | Fischer | 428/901 X |
| 5,010,641 | 4/1991 | Sisler | 428/901 X |
| 5,079,069 | 1/1992 | Howard et al. | 428/209 |

FOREIGN PATENT DOCUMENTS

WO91/02647 3/1991 PCT Int'l Appl. .

Primary Examiner—Carl J. Arbes
Attorney, Agent, or Firm—John A. Bucher

[57] ABSTRACT

An in situ method for forming a bypass capacitor element internally within a PCB comprising the steps of arranging one or more uncured dielectric sheets with conductive foils on opposite sides thereof and laminating the conductive foils to the dielectric sheet simultaneously as the PCB is formed by a final lamination step, the conductive foils preferably being laminated to another layer of the PCB prior to their arrangement adjacent the dielectric sheet or sheets, the dielectric foils even more preferably being initially laminated to additional dielectric sheets in order to form multiple bypass capacitive elements as a compound subassembly within the PCB.

11 Claims, 4 Drawing Sheets

IN SITU METHOD FOR FORMING A CAPACITIVE PCB

FIELD OF THE INVENTION

The present invention relates to a method for forming a capacitive printed circuit board (PCB) and more particularly to a method for forming a bypass capacitive element internally within the PCB.

BACKGROUND OF THE INVENTION

Printed circuit boards (PCBs) are commonly formed with internal power and ground planes which are connected with surface devices such as integrated circuits mounted on the PCBs. In the operation of the PCBs, it is commonly necessary to compensate for voltage fluctuations arising between the power and ground planes in the PCBs, particularly when sensitive devices such as integrated circuits are mounted on the board and connected with the power and ground planes for operation.

Voltage fluctuations of the type referred to above are commonly caused by the integrated circuits switching on and off, the fluctuations resulting in "noise" which is undesirable and/or unacceptable in many applications.

A preferred solution to this problem has been the provision of capacitors connected directly with the integrated circuits and/or with the power and ground planes in the vicinity of selected integrated circuits. Initially, surface capacitors were formed with the surface devices or separately mounted upon the surface of the PCB and connected with the respective devices or integrated circuits, etc., either by surface traces or by through-hole connections, for example.

Surface capacitors of this type were generally effective to reduce or minimize undesirable voltage fluctuations for the devices. However, surface or bypass capacitors have not always been effective in all applications. For example, the capacitors may tend to affect "response" of the integrated circuits or other devices because the capacitors have not only a capacitive value but an inductive value as well. In this regard, it is well known that inductance arises because of currents passing through conductors such as the traces or connectors coupling the capacitors with the devices or power and ground planes.

Furthermore, the integrated circuits or other devices are a primary source of radiated energy creating noise from voltage fluctuations in the PCBs. Different characteristics are commonly observed for such devices operating at different speeds or frequencies. Accordingly, the PCBs and device arrays as well as associated capacitors must commonly be designed to assure necessary noise suppression at both high and low speed operation.

The design of PCBs and device arrays as discussed above are well known to those skilled in the art of printed circuit board design. For purposes of the present invention, it is sufficient to realize that the use of surface mounted capacitors which are individually connected with the integrated circuits or devices substantially increase the complexity and cost of manufacture for the PCBs as well as undesirably affecting their reliability.

In order to overcome these limitations or for other reasons, a number of capacitive PCBs have been provided in the prior art. Initially, U.S. Pat. No. 4,775,573 issued Oct. 4, 1988 to Turek disclosed a multilayer printed circuit board having conductive and dielectric layers deposited on a surface of the board in order to form a bypass capacitor for devices mounted on the board.

More recently, U.S. Pat. No. 5,010,641 issued Apr. 30, 1991 to Sisler disclosed a method of making a multilayer printed circuit board with a fully cured dielectric material positioned between power and ground plane layers therein.

Still further, U.S. Pat. No. 5,079,069 issued Jan. 7, 1992 to Howard, et al. and assigned to Zycon Corporation, the assignee of the present invention, disclosed a capacitive printed circuit board including a capacitor laminate therein to provide a bypass capacitive function for devices mounted for formed on the PCB.

The printed circuit board variations disclosed above were suitable for their intended purposes. However, there has been found to remain a need for further improvements in methods for forming such PCBs and particularly for forming capacitive PCBs of the type disclosed by the Zycon patent noted above.

SUMMARY OF THE INVENTION

Accordingly, it is an object of the present invention to provide a method for in situ formation of a bypass capacitor element in a capacitive PCB.

More specifically, it is an object of the invention to provide such an in situ method wherein an uncured dielectric sheet is arranged between conductive foils to form a bypass capacitor element which is then arranged between layers of a PCB and laminated therein simultaneously as the PCB is formed by a final lamination step.

Preferably, the conductive foils are initially laminated or bonded to other layers of the PCB with portions of the foils being etched away prior to assembly adjacent the uncured dielectric sheet and lamination into the capacitive PCB.

It is a further object of the invention to provide such an in situ method wherein the conductive foils form power and ground planes within the PCB while being interconnected with surface devices on the PCB in order to supply capacitance for the devices.

It is a still further object of the invention to provide such an in situ method wherein one or more additional uncured dielectric sheets are similarly arranged between conductive foils and then laminated into the capacitive PCB, at least some of the conductive foils forming a part of two adjacent bypass capacitive elements in order to provide a compound bypass capacitive subassembly within the PCB.

Additional objects and advantages of the invention are made apparent in the following specification having reference to the accompanying drawings.

DESCRIPTION OF THE PREFERRED EMBODIMENTS

An in situ method for forming a bypass capacitor element internally within a capacitive printed circuit board (PCB) is described in greater detail below. Such capacitive PCBs commonly support large numbers of devices which are typically mounted on surfaces of the board. Substantial amounts of capacitance may be required for the devices on the PCB. In this regard, the above noted Zycon patent initially disclosed the concept of borrowed or shared capacitance and, for that reason, is incorporated herein by reference as through set forth in its entirety. According to this concept of borrowed or shared capacitance, capacitive elements in the PCB are capable of satisfying capacitive requirements for surface devices even though the total capacitance requirements for the devices are greater than the capacitance of the bypass capacitive elements. According to the above patent, such operation was made possible based on intermittent operation of the devices so that actual capacitance requirements of the devices at any given time are only a fraction of the cumulative capacitive requirements for all the devices.

Even though the present invention contemplates the use of such a concept of borrowed or shared capacitance, it is also important to understand that the bypass capacitor element of the invention may in fact be capable of simultaneously satisfying the cumulative capacitive requirements for all of the devices. For example, with the bypass capacitor element of the invention being of a compound type as preferably described in greater detail below, it is possible to provide a substantial number of capacitor elements within the PCB, each of the capacitor elements extending substantially throughout the surface area of the board. In this manner, it is accordingly possible to substantially increase the available capacitance provided in the capacitive PCB of the invention. Secondly, it is also possible to substantially increase the total capacitance of the capacitive PCB by using dielectric materials of substantially increased dielectric constant. Accordingly, the present invention contemplates not only a capacitive PCB based on the concept of borrowed or shared capacitance as noted above but also a capacitive PCB wherein the total capacitance is approximately equal to or even in excess of total capacitive requirements for devices mounted on the PCB.

Figure 1:
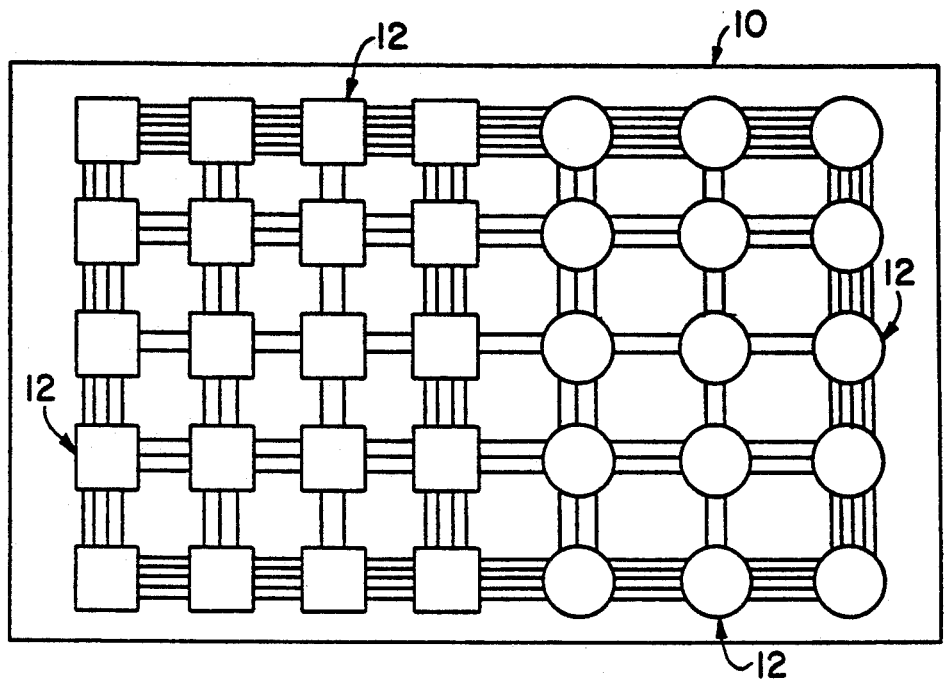
FIG. 1 is a plan view of a capacitive printed circuit board (PCB) constructed according to the present invention.

Referring initially to FIG. 1, a capacitive PCB constructed according to the present invention is generally indicated at 10. The printed circuit board 10 is of generally conventional construction except for the provision of an internal capacitor laminate as described in greater detail below. Accordingly, external features of the capacitive printed circuit board 10 are only briefly noted, the architecture and design considerations for the printed circuit board otherwise being generally of a type well known to those skilled in the art.

For purposes of the present invention, it is sufficient to understand that the capacitive PCB 10 is of a type including large numbers of devices 12 arranged upon its surfaces. In accordance with well known printed circuit board technology, the devices or components may be arranged upon one or both sides of the board and may include both active devices such as integrated circuits, transistors, etc. Such active devices may even include components such as vacuum tubes or the like. The devices 12 may also include passive devices such as capacitors, resistors, inductors, etc.

In the design of PCBs such as that illustrated at 10, it is common practice to employ a power source described and illustrated in greater detail below which is embodied by power and ground planes or conductors formed as laminates in the printed circuit board itself. A variety of configurations are provided for mounting the devices upon the PCB and for interconnecting them both with the power source and each other. Although such design considerations are generally outside the scope of the present invention, two such configurations are described below with reference to FIGS. 2 and 3.

Figure 2:
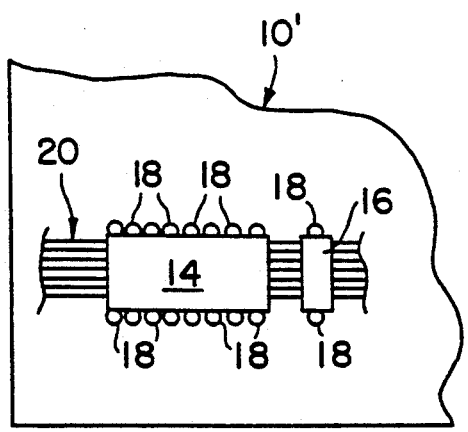
FIG. 2 is an enlarged fragmentary view of a portion of the printed circuit board showing a device such as an integrated circuit mounted on the board and connected with other devices and a power source in the board by through-hole connections.

Referring to FIG. 2, an active device such as integrated circuit is indicated at 14 with a passive device, specifically a capacitor being generally indicated at 16. These devices, particularly the active device or integrated circuit 14, are representative of large numbers of devices arranged upon the printed circuit board as generally indicated in FIG. 1. In a configuration of the type illustrated in FIG. 2, the devices are interconnected to power and ground planes within the printed circuit board and to other devices by through-hole connectors or pins generally indicated at 18. In FIG. 2, two such connectors or pins 18 are illustrated for the capacitor 16 while the integrated circuit 14 is of a 16-pin design including 16 through-hole connectors or pins 18 as illustrated. Additional traces may be provided as generally indicated at 20 for facilitating interconnection of the various devices upon the printed circuit board.

Figure 3:
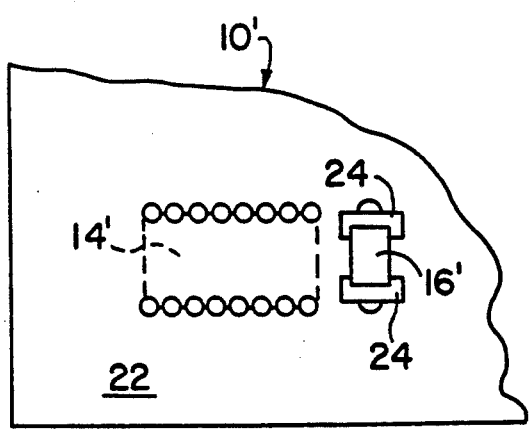
FIG. 3 is a view similar to FIG. 2 while illustrating a surface mounted device arranged upon the board and connected with other devices or components and a power source in the board by surface traces or paths.

Another configuration for a printed circuit board is indicated by the fragmentary representation of FIG. 3 which similarly illustrates an active device such as an integrated circuit being generally indicated at 14' and illustrated in phantom since it is mounted on the opposite or top surface of the circuit board from the bottom surface illustrated in FIG. 3. A passive device or capacitor 16' is also illustrated in FIG. 3 preferably mounted on the bottom surface 22 of the printed circuit board. In the surface mounted configuration of FIG. 3, both the active device 14' and the capacitor 16' are mounted upon surface traces or pads 24. In accordance with well known techniques in the printed circuit board technology, the pads 24 facilitate surface mounting of the devices while providing for interconnection of the devices with each other and with a power source such as the internal power and ground planes referred to above by both surface traces and through-hole connectors or pins where necessary.

With reference to both FIGS. 2 and 3, the present invention particularly contemplates the use of an internal capacitive layer in the form of the capacitor laminate of the present invention in order to replace large numbers of surface capacitors. Accordingly, although most of the surface capacitors are replaced in the printed circuit board 10 by the capacitor laminate of the invention, a limited number of surface capacitors may still be desirable as illustrated in FIGS. 2 and 3, at least for the purpose of achieving low frequency tuning as discussed in greater detail below.

Figure 4:
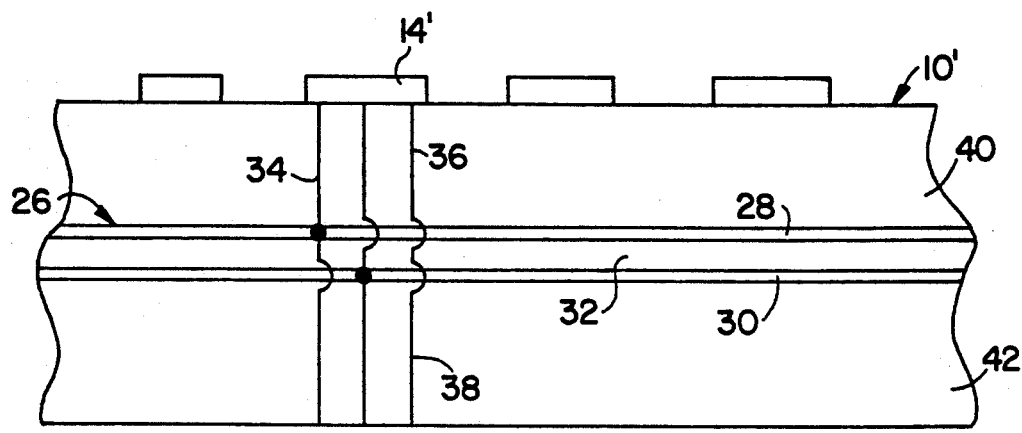
FIG. 4 is a schematic sectional view of a printed circuit board illustrating connections or traces for coupling a representative surface device on the board to power and ground planes formed by an internal capacitor arranged within the PCB and constructed according to the present invention.

FIG. 4 is a sectional view of the capacitive PCB of FIG. 1 and illustrates a bypass capacitor element or subassembly 26 constructed according to the method of the present invention for forming an internal capacitive device within the printed circuit board 10. The bypass capacitor element 26 includes conductive foils 28 and 30 arranged on opposite sides of a dielectric sheet 32. Preferably, the conductive foils 28 and 30 form power and ground planes which are interconnected with the surface device 14' by respective power and ground leads 34 and 36. Additional signal traces such as that indicated at 38 are also provided for interconnecting devices on the PCB or for making other connections within the PCB as necessary. The PCB 10' of FIG. 4 also includes additional layers 40 and 42 arranged on opposite sides of the capacitor element 26.

Figure 5:
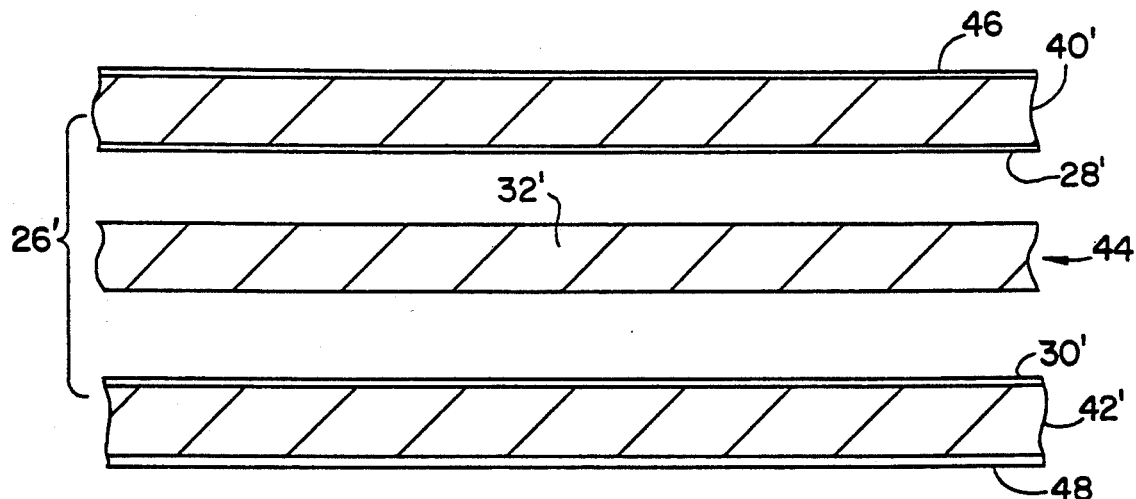
FIG. 5 illustrates an exploded assembly of components suitable for forming a capacitive PCB according to the in situ method of the present invention.

Referring now to FIG. 5, an exploded assembly of components is generally indicated at 44 for forming a capacitive PCB such as those indicated at 10 and 10' in FIGS. 1-4 according to the in situ method of the present invention. Accordingly, the assembly 44 includes dielectric foils 28' and 30' arranged on opposite sides of a dielectric sheet 32' to form a capacitor element 26' generally corresponding to that indicated at 26 in FIG. 4. However, in the assembly of FIG. 5, it is important to note that the dielectric layer or sheet 32' is uncured or in a so-called "B" stage according to conventional PCB terminology. Additional PCB layers such as those indicated at 40' and 42' are arranged on opposite sides of the conductive foils 28' and 30'. Preferably, the layers 40' and 42' are respectively laminated to the dielectric foils 28' and 30' so that the conductive foils can be etched prior to their arrangement within the assembly 44. Even more preferably, the conductive foils 28 and 30' form power and ground planes for the PCB 10'. In accordance with conventional PCB practice, portions of the conductive foils or power and ground planes 28' and 30' are etched away or removed. This allows for formation of through-holes in the PCB for receiving leads such as those indicated at 34, 36 and 38 in FIG. 4.

Additional conductive foils layers 46 and 48 may be laminated to exterior surfaces of the layers 40' and 42'. With the layers 40' and 42' being formed from dielectric material, they are of course converted to a fully cured or so-called "C" stage during lamination to the conductive foils 28' and 30' as well as the outer foils 46 and 48.

With the components of the assembly 44 arranged as illustrated in FIG. 5, they are subjected to heat and pressure in a conventional final lamination step well known to those skilled in the printed circuit board art to form a PCB such as that indicated at 10 or 10' in FIGS. 1-4 with simultaneous in situ formation or lamination of the capacitor element 26' including the conductive foils 28' and 30' as well as the dielectric sheet 32'. During the final lamination step, the dielectric sheet 32' is laminated to both of the conductive foils 28' and 30' while also being converted to a fully cured or "C" stage condition generally similar to the other layers 40' and 42'.

Figure 6A:
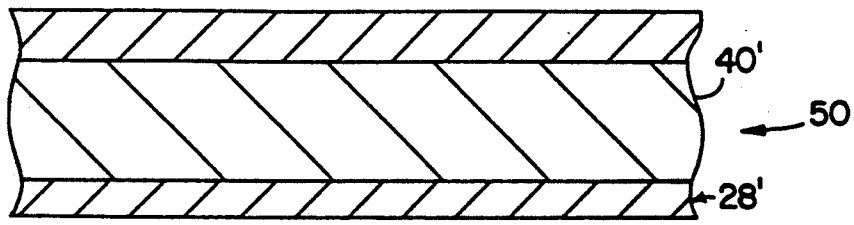
FIGS. 6A, 6B, 6C and 6D illustrate the in situ process of the present invention for forming a capacitive PCB and simultaneously forming a bypass internal capacitor therein.

The method of the present invention is described in somewhat greater detail below in FIGS. 6A-6B. Referring initially to FIG. 6A, an initial lamination product 50 is obtained or formed including the fully cured dielectric sheet 40' with conductive foils 28' and 46' laminated or bonded on opposite sides thereof.

Figure 6B:
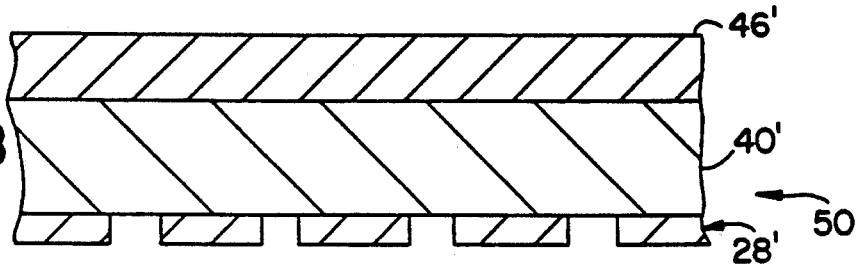

Referring also to FIG. 6B, with the conductive foil 28' forming for example a power plane for a PCB, the conductive foil 28' is then etched as indicated in FIG. 6B for reasons discussed in greater detail above.

Figure 6C:
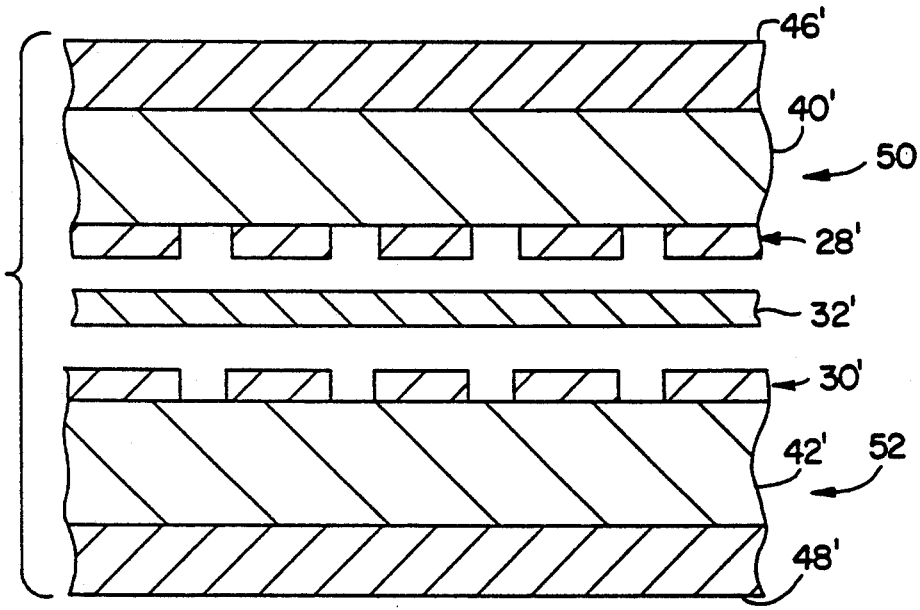

Referring now to FIG. 6C, another lamination product 52 is formed in a similar manner as the lamination product 50. The lamination product 52 includes the other PCB layer 42' and the conductive foils 30' and 48'. The conductive foil 30' also preferably forms a ground plane for a resulting PCB and is similarly etched as the conductive foil 28' in FIG. 6B.

Continuing with reference to FIG. 6C, the uncured dielectric sheet 32' is then arranged between the lamination products 50 and 52 so that it is adjacent both the conductive foils or power and ground planes 28' and 30'.

Figure 6D:
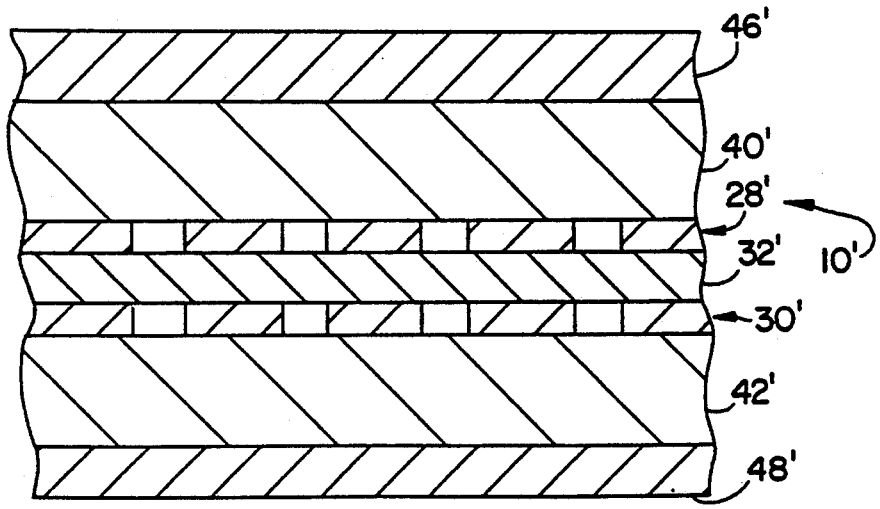

With the lamination products 50 and 52 arranged on opposite sides of the uncured dielectric sheet 32' as illustrated in FIG. 6C, they are then subjected to heat and pressure in a conventional final lamination step as described above for forming the PCB with simultaneous in situ formation of the capacitor element 26' from the dielectric sheet 32' and the conductive foils 28' and 30'. Here again, the final lamination step results in conversion of the uncured dielectric sheet 32' to a fully cured or "C" stage condition as described above. The final lamination step described above with reference to FIG. 6C results in formation of a finished capacitive PCB 10' as illustrated in FIG. 6D.

The preceding method described particularly with reference to FIGS. 5 and 6A-6D can also be carried out with additional capacitor elements formed within the PCB during the final lamination step similar to the capacitor element 26'. Such an arrangement is not illustrated in the drawings but simply includes one or more additional capacitor elements such as that indicated at 26 or 26' similarly formed during final lamination of the PCB and preferably spaced apart by additional PCB layers (not shown).

The method of the present invention also contemplates formation of the capacitor elements as compound bypass capacitor subassemblies formed according to the method of the present invention as described below with reference to FIGS. 7 and 8.

Figure 7:
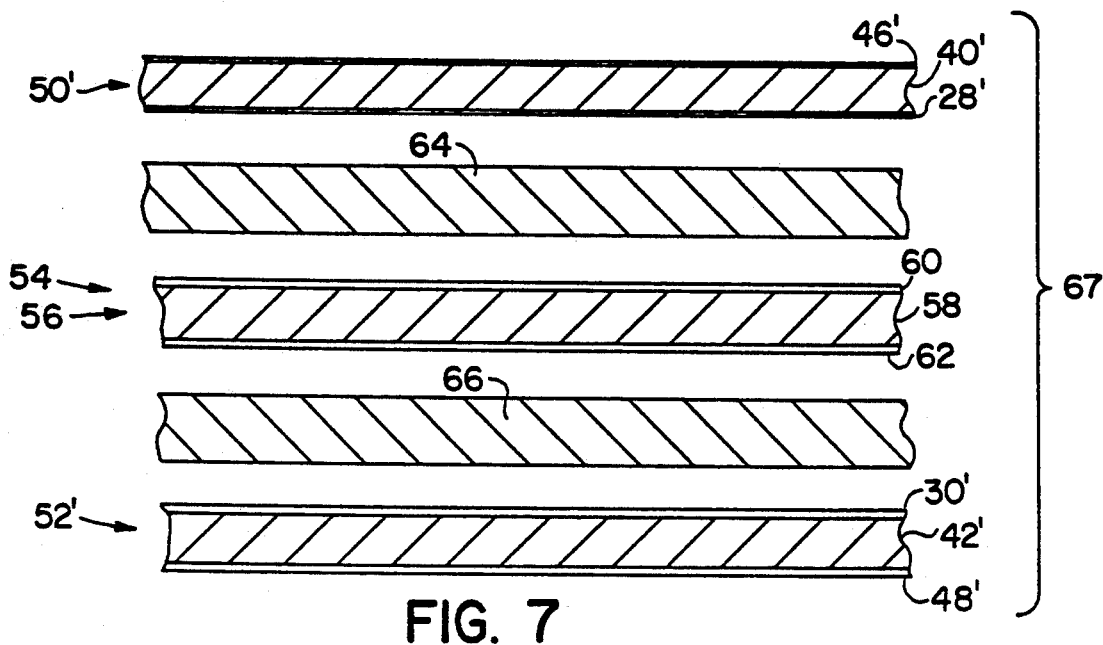
FIGS. 7 and 8 illustrate additional embodiments of the method of the present invention for in situ formation of compound bypass internal capacitors within a capacitive PCB according to the present invention.

Referring initially to FIG. 7, an exploded assembly 54 includes lamination product 50' and 52' similar to the lamination products 50 52 of FIGS. 6A-6D. An additional lamination product 56 is centrally arranged within the assembly 54 between the lamination products 50' and 52'. The lamination product 56 includes a fully cured dielectric sheet 58 laminated to conductive foils 60 and 62.

With the assembly as described above, the conductive foils 28' and 62 are preferably power planes for a PCB resulting from the assembly of FIG. 7 with the conductive foils 30' and 60 being ground planes for the PCB. All of the conductive foils 28', 30', 60 and 62 may be etched if desired after they are laminated respectively onto their supporting dielectric sheets.

Thereafter, uncured dielectric sheets 64 and 66 are arranged respectively between the conductive foils 28', 60 and 30', 62. The components of the assembly 54 are then subjected to heat and pressure, again in a conventional manner for a final lamination step to result in formation of the PCB and simultaneous in situ formation of a compound bypass capacitive subassembly 64. The subassembly 64 includes three capacitive elements formed respectively by the conductive foils 28' and 60 together with the dielectric sheet 64, the conductive foils 60 and 62 together with the dielectric sheet 58 and the conductive foils 30' and 62 together with the dielectric sheet 66. The dielectric sheet 64 and 66 are of course converted to a fully cured or "C" stage condition during the final lamination step. Within the subassembly 64, it may also be seen that certain of the conductive foils, particularly those indicated at 60 and 62 are included in multiple capacitor elements to achieve greater efficiency and an increased capacitance for the resulting PCB.

Figure 8:
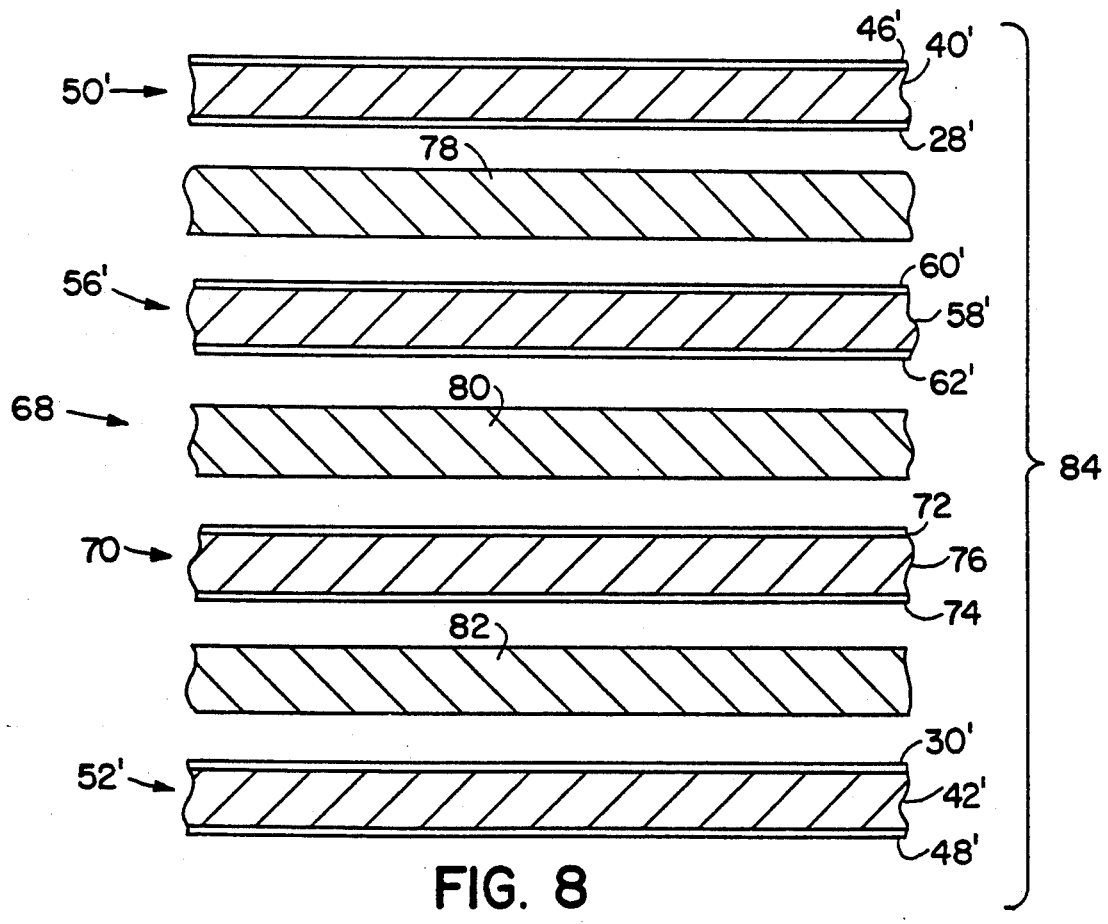

Referring now to FIG. 8, another exploded assembly of components is generally indicated at 68 for forming a capacitive PCB. The assembly 68 includes lamination products 50', 52' and 56' similar to the lamination products of FIG. 7. In addition, the assembly 68 includes another lamination product 70 formed from conductive foils 72 and 74 laminated to a dielectric sheet 76.

Uncured sheets of dielectric material respectively indicated at 78, 80 and 82 are then respectively arranged between adjacent pairs of conductive foils 28', 60'; 62', 72 and 30', 74. The components of the assembly 68 are then similarly subjected to heat and pressure in a conventional final lamination step for forming a resulting PCB with simultaneous in situ formation of a compound bypass capacitive subassembly 84 including five capacitor elements formed respectively by adjacent conductive foils and intervening dielectric sheets.

In the method according to the present invention described above with reference to FIGS. 7 and 8, it may be seen that alternate capacitor elements are formed by lamination or the conversion of uncured dielectric sheets to a fully cured condition while the other capacitor elements are laminated together prior to the final lamination step described above. In this regard, it is essential to the present invention that at least one of the capacitor elements be formed by conversion of an uncured sheet of dielectric to a fully cured condition as described above.

The capacitive PCBs described above with reference to the figures are designed to provide necessary capacitance for all or a substantial number of devices mounted thereupon. The devices may be interconnected with the power and ground planes either by separate through-hole pins or by surface traces of the type illustrated respectively in FIGS. 2 and 3. With the compound bypass capacitive subassemblies illustrated in FIGS. 7 and 8, the power and ground planes are respectively interconnected in order to assure parallel operation of the capacitor elements in each subassembly.

Because of the very substantial capacitance required for the combined devices, the capacitive PCBs of the present invention are preferably contemplated for operation based on the concept of borrowed capacitance as discussed above wherein the total capacitance of the capacitor elements in any of the capacitive PCBs is less than the total required capacitance for all of its devices. However, as noted above, the invention contemplates that any of the capacitive PCBs may be provided with sufficient capacitance equal to or greater than the cumulative capacitance requirements of the devices. This would of course permit simultaneous operation of all of the devices on the PCB. As noted above, higher capacitive values may be obtained either by an increased number of capacitor elements in the PCB and/or by the use of higher dielectric constant materials in the capacitor elements.

As was also noted above, the conductive foils in the capacitive PCBs are preferably formed with a sufficient mass of copper or conductive material per unit area in order to achieve structural rigidity or self-support and also preferably to permit sufficient electron flow or current flow in accordance with the concept of borrowed capacitance. More specifically, it is contemplated that each of the conductive foils be formed with at least about 0.5 ounces of copper per square foot, that mass corresponding generally to a thickness of about 0.5 mils, more specifically about 0.6–0.7 mils. The thickness of the conductive sheets may be increased, for example, in order to meet larger voltage or current carrying capacities for the power and ground planes in a particular application. Preferably, each of the conductive sheets includes about 1–2 ounces of copper per square foot, those masses corresponding to thicknesses for the individual sheets in the range of about 1.2–2.4 mils. More preferably, the conductive foils are formed with about one ounce of copper per square foot or having a thickness in the range of about 1.2–1.4 mils to achieve optimum performance of the capacitor laminates. That amount of copper in each of the conductive foils is also selected as a minimum for achieving good structural rigidity within the conductive sheets alone prior to their lamination into the capacitor elements.

The composition and thickness of the dielectric sheets are selected to achieve necessary capacitance, again in accordance with the concept of borrowed capacitance, and also to achieve structural rigidity for the dielectric sheets both prior to and after inclusion within the compound capacitive subassembly.

The present invention preferably contemplates the use of dielectric material having a dielectric constant of at least about 4. A range of dielectric materials widely available in the present state-of-the-art having dielectric constants in the range of about 4–5. Furthermore, it is possible to formulate dielectric compositions, for example, from ceramic filled epoxies, with dielectric constants ranging up toward 10 for example. Thus, the present invention preferably contemplates use of a material with a dielectric constant of at least about 4, more preferably within a range of about 4–5 and most preferably about 4.7, at least for the specific composition contemplated in the preferred embodiment. However, much higher capacitances are also contemplated, as discussed above.

A preferred dielectric constant can be achieved by combinations of a woven component and a resin component combined together to form the necessary combination of dielectric constant and structural rigidity. The woven component may include polymers such as polytetra fluoroethylene (available under the trade names TEFLON and GORETEX) and epoxies. However, the woven components are preferably formed from glass which may be of a quartz variety but is preferably silica, the glass being formed in threads which are then woven together to form sheets filled or impregnated with a selected resin. The resins are commonly selected for fire retardant characteristics and may include materials such as cyanate esters, polyimides, kapton materials and other known dielectric materials. However, the resin is preferably an epoxy, again in order to take advantage of the existing state-of-the-art regarding use of such resins in PCB manufacture.

A dielectric sheet formed from a single woven layer of glass and about 70.0% by weight resin has the preferred dielectric constant of 4.7 as noted above while also exhibiting good structural rigidity at a thickness of about 1.5 mils.

The thickness of the dielectric material in the present invention is selected not only to achieve the desired capacitance but also to assure electrical integrity, particularly the prevention of shorts developing between the conductive foils in the capacitor elements. Common practice contemplates treatment of the surfaces of the conductive sheets adjacent the dielectric sheet in order to enhance adhesion within the capacitor elements. Such adhesion is necessary not only for structural integrity but also to assure proper electrical performance. Typically adjacent surfaces of the conductive foils are treated by deposition in zinc or zinc and copper (a brass alloy), usually by plating, in order to form roughened surfaces in a manner well known to those skilled in the PCB art. These roughened surfaces provide "tooth" to enhance mechanical bonding to the dielectric material.

Another aspect of the invention is noted with respect to characteristics of the conductive foils. In accordance with standard practice, each of the conductive foils commonly has a matte or tooth side and a barrel or smooth side. Surface variations of the tooth side of the conductive foils is substantially greater than for the opposite smooth side. Such conductive foils are commercially supplied by a number of sources including Gould Electronics and Texas Instruments. Conductive foils formed from copper are available from Gould under the trade name "JTC" FOIL as described in Gould Bulletin 88401 published by Gould, Inc., Eastlake, Ohio in March 1989. Other foils available from Gould include those available under the trade names LOW PROFILE "JTC" FOIL and "TC/TC" DOUBLE TREATED COPPER FOIL and described respectively in Bulletin 88406 and Bulletin 88405, both published in March 1989 by Gould, Inc.

In the capacitor elements of the present invention, the greater surface differential for the rough side of the foil is generally excessive for preferred dimensions of dielectric as noted above. This is a consideration in the present invention since, for certain of the conductive foils, both surfaces of those foils are employed in different capacitor elements. In order to assure "capacitive integrity", that is, absence of shorts, etc., the present invention contemplates a number of different approaches for overcoming this problem.

Initially, the thickness of the dielectric sheets may be increased adjacent the rough sides of the conductive foils in order to assure adequate spacing between all surface portions of opposing conductive foils. Alternatively, the surface variations for the rough side of the foil may be reduced, for example by further calendaring or scrubbing. Generally, a calendaring operation as contemplated for compacting ductile material of the foil in order to reduce surface variations on the rough side thereof. In a scrubbing or abrading operation, some of the conductive foil material would be removed on the rough side again for the purpose of reducing surface variations thereon. The use of a scrubbing or abrading technique might require a somewhat thicker conductive foil if excessive amounts of material are to be removed.

Yet another approach in this regard is to coat the rough side of the conductive foil, for example with oxide, again for the purpose of reducing surface variations. In this regard, it is also noted that both surfaces of the conductive foils are preferably surface treated in a generally conventional manner in order to assure adhesion to adjacent layers, in the case of the present invention, the dielectric sheets.

In any event, the problem of different surface variations on opposite sides of the conductive foil can be minimized and/or eliminated by one or more of the above techniques.

Accordingly, there have been described above a variety of methods for in situ formation of capacitive elements within PCBs during a final lamination step. Modifications and variations in addition to those described above will be apparent to those skilled in the art. Accordingly, the scope of the present invention is defined only by the following appended claims which are also set forth as further examples of the invention.

What is claimed is:

1. An in situ method of forming a bypass capacitor element internally within a capacitive printed circuit board (PCB), comprising the steps of selecting an uncured dielectric sheet and conductive foils as components of the bypass capacitor element, arranging the conductive foils as layers adjacent both sides of the uncured dielectric sheet and between other PCB layers, and thereafter laminating the conductive foils to the dielectric sheet in a final lamination step simultaneously forming the capacitive PCB and the internal bypass capacitor element.

2. The method of claim 1 further comprising the step of providing means for interconnecting the conductive foils with surface devices on the PCB.

3. The method of claim 2 further comprising the step of mounting surface devices on the PCB and connecting them with the conductive foils by the interconnecting means.

4. The method of claim 1 further comprising the step of initially bonding the conductive foils to adjacent PCB layers prior to arranging them adjacent both sides of the dielectric sheet.

5. The method of claim 4 further comprising the step of etching away portions of the conductive foils after they are bonded to the adjacent PCB layers.

6. The method of claim 5 wherein the adjacent PCB layers are also dielectric sheets and further comprising additional conductive foils so that compound bypass capacitive elements are respectively formed by the dielectric sheets with at least a portion of the conductive foils being included in two adjacent bypass capacitive elements.

7. The method of claim 6 further comprising the step of respectively connecting together odd and even numbered conductive foils to form a compound bypass capacitive subassembly.

8. The method of claim 7 further comprising the step of providing means for interconnecting the conductive foils with surface devices on the PCB.

9. The method of claim 8 further comprising the step of mounting surface devices on the PCB and connecting them with the conductive foils by the interconnecting means.

10. The method of claim 7 wherein alternate conductive foils are power and ground planes respectively for the capacitive PCB.

11. The method of claim 3 wherein the conductive foils are power and ground planes for the capacitive PCB.

* * * * *